US008867577B2

(12) United States Patent
Fukaya et al.

(10) Patent No.: US 8,867,577 B2
(45) Date of Patent: Oct. 21, 2014

(54) LASER LIGHT SOURCE

(71) Applicants: Shinpei Fukaya, Tokorozawa (JP); Masafumi Ide, Tokorozawa (JP)

(72) Inventors: Shinpei Fukaya, Tokorozawa (JP); Masafumi Ide, Tokorozawa (JP)

(73) Assignee: Citizen Holdings Co., Ltd., Tokyo (JP)

( * ) Notice: Subject to any disclaimer, the term of this patent is extended or adjusted under 35 U.S.C. 154(b) by 0 days.

(21) Appl. No.: 13/721,617

(22) Filed: Dec. 20, 2012

(65) Prior Publication Data

US 2013/0170511 A1    Jul. 4, 2013

(30) Foreign Application Priority Data

Dec. 28, 2011  (JP) .................................. 2011-290006

(51) Int. Cl.
| | |
|---|---|
| *H01S 3/098* | (2006.01) |
| *H01S 3/10* | (2006.01) |
| *H01S 5/14* | (2006.01) |
| *H01S 3/109* | (2006.01) |
| *H01S 5/022* | (2006.01) |

(52) U.S. Cl.
CPC . *H01S 3/10* (2013.01); *H01S 5/146* (2013.01); *H01S 3/109* (2013.01); *H01S 5/141* (2013.01); *H01S 5/02284* (2013.01); *H01S 5/02252* (2013.01)
USPC .................. 372/19; 372/22; 372/21; 372/102

(58) Field of Classification Search
CPC ....... H01S 3/10; H01S 3/08031; H01S 3/109; H01S 5/146; H01S 5/141; H01S 5/02284
USPC ........................................ 372/19, 22, 21, 102
See application file for complete search history.

(56) References Cited

U.S. PATENT DOCUMENTS

| | | | | |
|---|---|---|---|---|
| 5,619,369 | A | * | 4/1997 | Yamamoto et al. ............ 359/332 |
| 2011/0182082 | A1 | * | 7/2011 | Ide et al. ........................ 362/553 |

FOREIGN PATENT DOCUMENTS

JP      2003-270686 A      9/2003

\* cited by examiner

*Primary Examiner* — Kinam Park
(74) *Attorney, Agent, or Firm* — Sughrue Mion, PLLC

(57) ABSTRACT

A laser light source according to the present invention includes a laser element that outputs a fundamental wave; a wavelength conversion element into which the fundamental wave is input and that converts at least a part of the fundamental wave input therein to a converted wave having a wavelength shorter than the wavelength of the fundamental wave; a waveguide that attenuates a component of the fundamental wave included in an output wave from the wavelength conversion element; and a diffraction grating that is formed on the waveguide and feeds back the fundamental wave output from the wavelength conversion element to lock the wavelength or the frequency of the fundamental wave output from the laser element. The diffraction grating is formed at a position determined taking into account an amount by which the fundamental wave is attenuated in the waveguide.

6 Claims, 4 Drawing Sheets

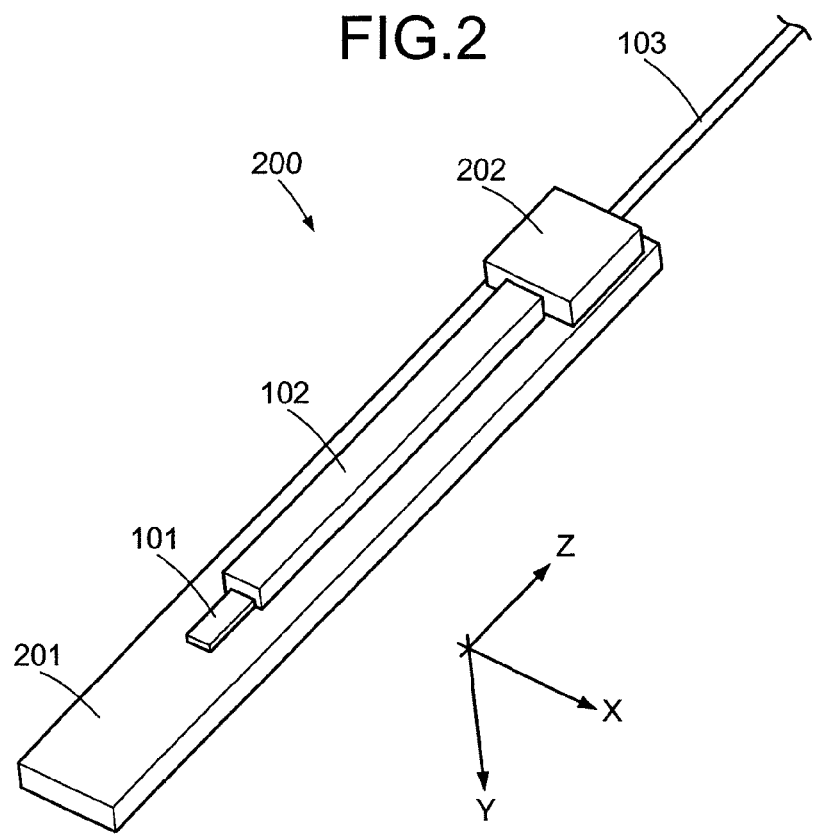
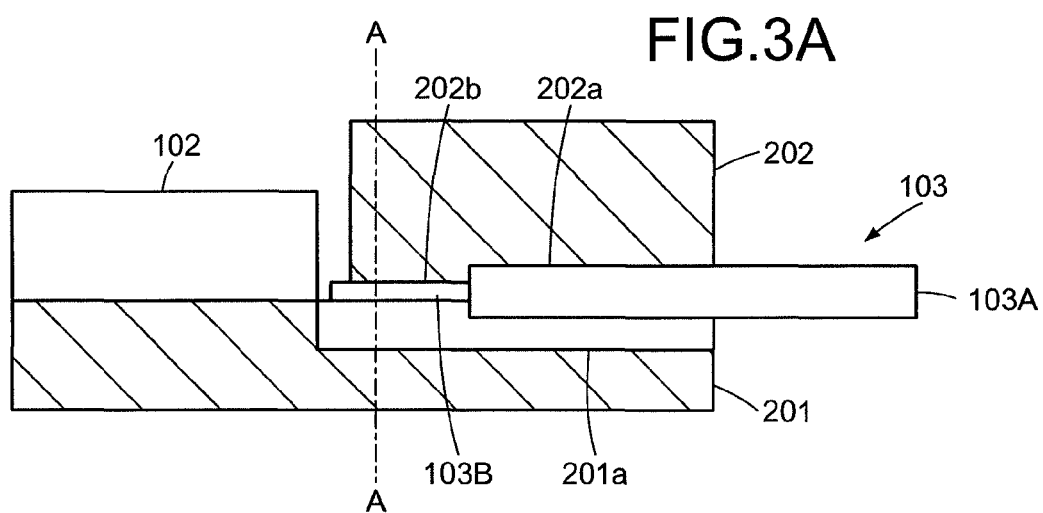

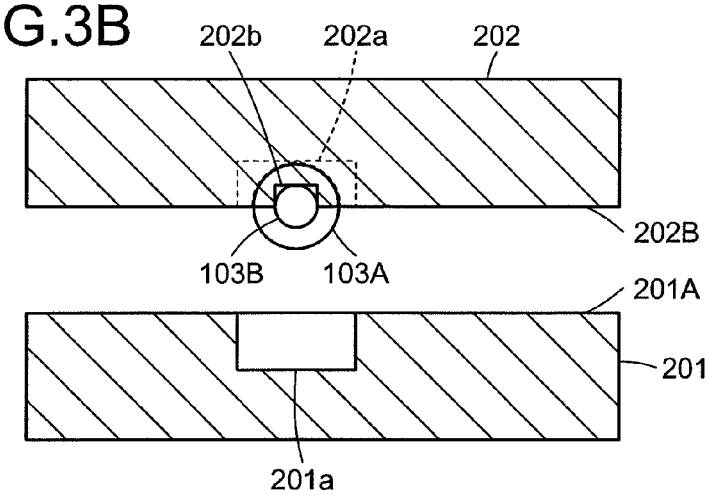
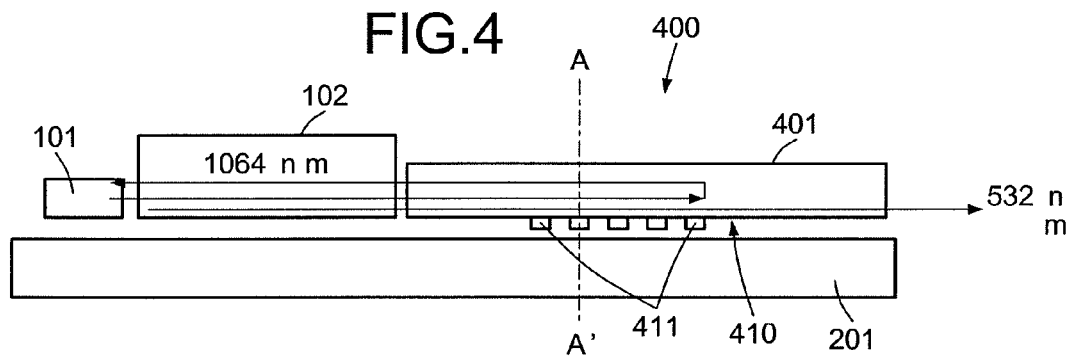
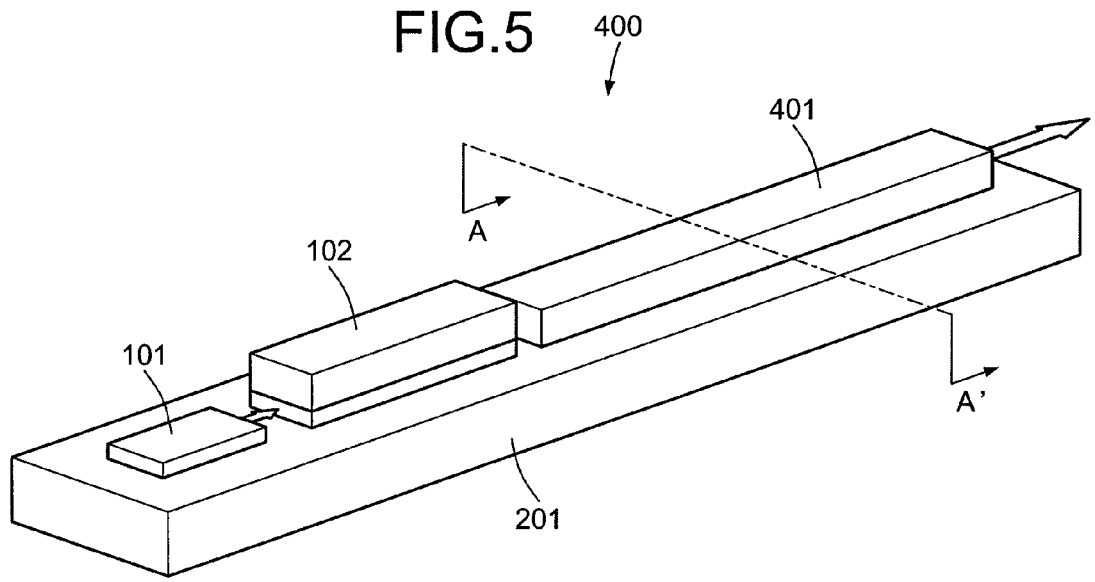

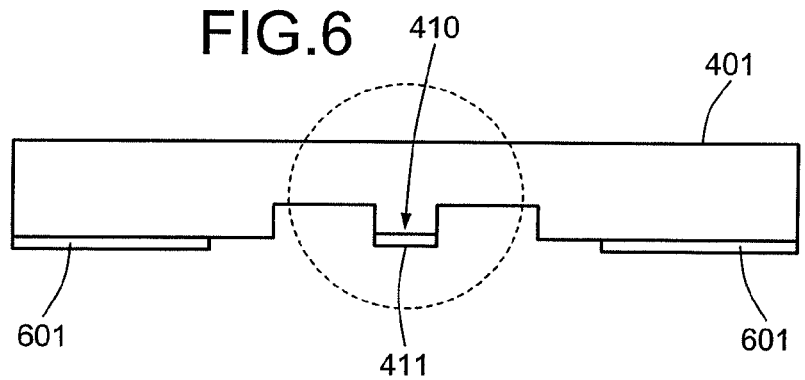
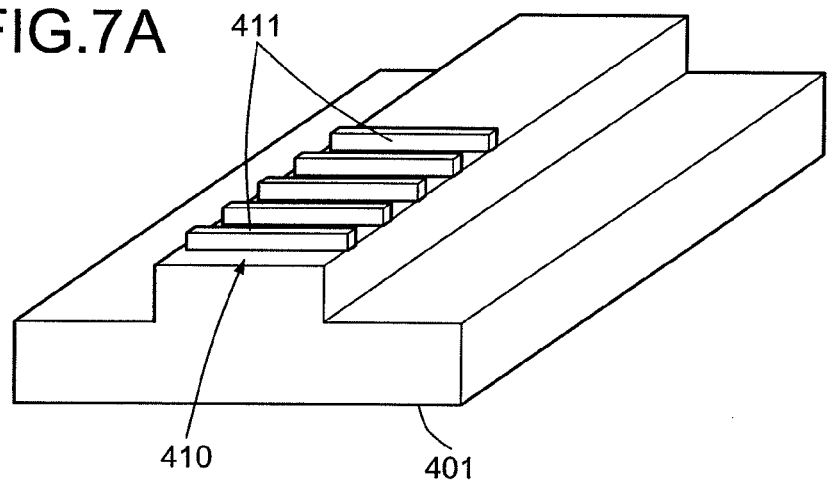
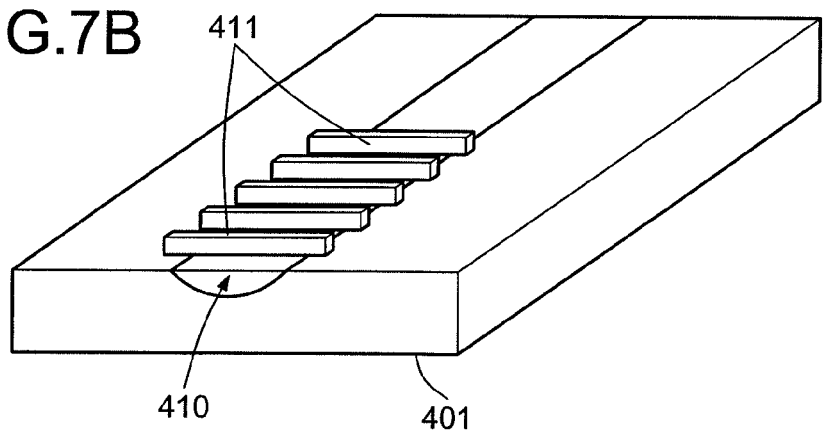

LASER LIGHT SOURCE

BACKGROUND OF THE INVENTION

1. Field of the Invention

The present invention relates to a wavelength-conversion laser light source that includes a wavelength conversion element.

2. Description of the Related Art

A laser light source outputs a near-infrared (NIR) fundamental wave. Meanwhile, a technology for wavelength conversion to a visible wavelength to output a second harmonic (a converted wave) is disclosed in, for example, Japanese Laid-Open Patent Publication No. 2003-270686 (page 2, FIG. 1). Japanese Laid-Open Patent Publication No. 2003-270686 describes a configuration of a fiber-pigtailed laser light source in which light output from a laser diode (LD) is input to and oscillated by a polarization maintaining fiber in which a fiber Bragg grating (FBG) is formed. The fundamental wave is converted to the converted wave by a wavelength conversion element arranged on a path for wavelength locking.

However, the conventional technology described above has a problem in that a fundamental wave that has not been converted by the wavelength conversion element is output from the polarization maintaining fiber since the polarization maintaining fiber functions as a part of an oscillator. A filter has to be provided to remove the fundamental wave from the output light, and a lens has to be further provided between the LD and the polarization maintaining fiber, thereby inhibiting size reductions. Further, the light output from the LD is coupled at many points since the light is output through multiple optical elements, thereby increasing optical loss.

To solve the problem of the conventional technology described above, an object of the present invention is to provide a small laser light source that can efficiently (with minimal loss) output a converted wave from which the component of the fundamental wave is removed.

SUMMARY OF THE INVENTION

To solve the problem described above and achieve an object, a laser light source according to the present invention includes a laser element that outputs a fundamental wave; a wavelength conversion element into which the fundamental wave is input and that converts at least a part of the fundamental wave input therein to a converted wave having a wavelength shorter than the wavelength of the fundamental wave; a waveguide that attenuates a component of the fundamental wave included in an output wave from the wavelength conversion element; and a diffraction grating that is formed on the waveguide and feeds back the fundamental wave output from the wavelength conversion element to lock the wavelength or the frequency of the fundamental wave output from the laser element. The diffraction grating is formed at a position determined taking into account an amount by which the fundamental wave is attenuated in the waveguide.

BRIEF DESCRIPTION OF THE DRAWINGS

FIG. 2 is a perspective view of an example of a module configuration of a laser light source according to a first embodiment;

FIG. 3A is a partial cross-sectional view of the module configuration depicted in FIG. 2;

FIG. 3B is a cross-sectional view along A-A line in FIG. 3A;

FIG. 4 is a side view of an example of a module configuration of the laser light source according to a second embodiment;

FIG. 5 is a perspective view of the example of module configuration of the laser light source according to the second embodiment;

FIG. 6 is a cross-sectional view along A-A' line in FIGS. 4 and 5;

FIG. 7A is an enlarged partial perspective view (part 1) of diffraction gratings; and FIG. 7B is an enlarged partial perspective view (part 2) of the diffraction gratings.

DETAILED DESCRIPTION OF THE PREFERRED EMBODIMENTS

Figure 1:
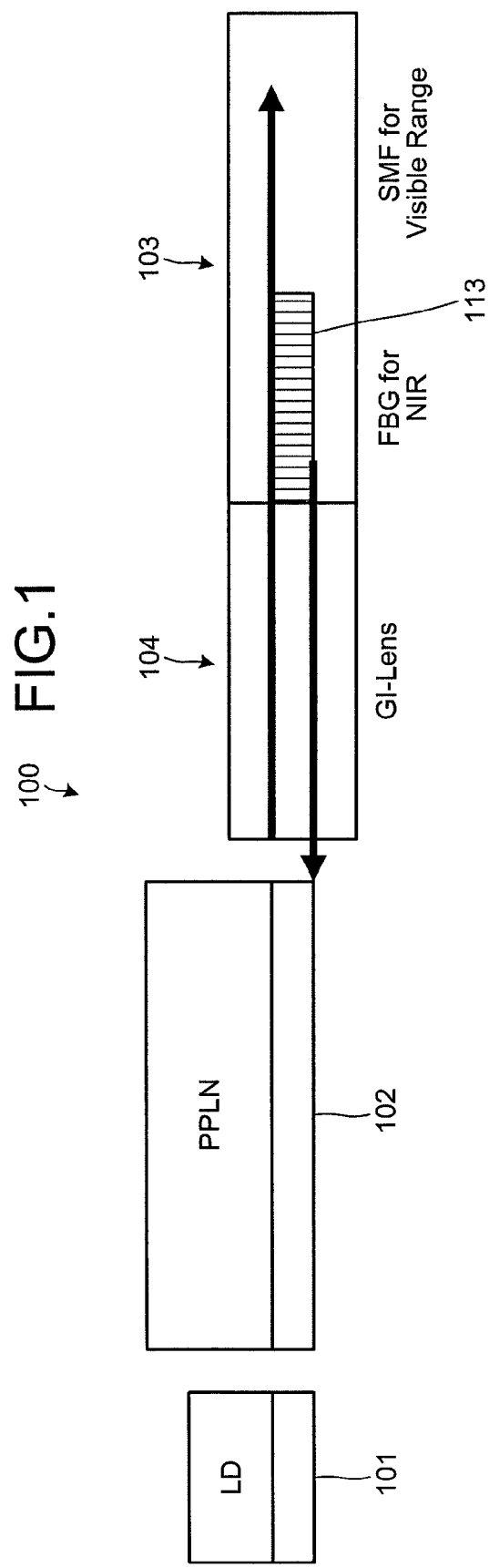
FIG. 1 is a diagram of a configuration of a laser light source according to the present invention.

Preferred embodiments of a laser light source according to the present invention are described in detail with reference to the accompanying drawings.

EMBODIMENTS

FIG. 1 is a diagram of a configuration of a laser light source according to the present invention. A laser light source 100 is a second-harmonic-generation (SHG) laser light source that includes a wavelength conversion element 102 and outputs a second harmonic. The laser light source 100 is configured by a laser element (LD) 101, a wavelength conversion element 102, a waveguide 103, and a GI lens 104 as a coupling member.

The LD 101 outputs laser light of a near-infrared fundamental wave (1064 nm). Periodically poled lithium niobate (PPLN) is used as the wavelength conversion element 102, and the fundamental wave (of, for example, 1064 nm band) output from the LD 101 is input into the wavelength conversion element 102. The fundamental wave propagates through the wavelength conversion element 102, and is converted to the second harmonic (SH) (the converted wave of, for example, 532 nm band).

The waveguide 103 is configured by an optical fiber 103 (an optical fiber for visible light) that attenuates the component of the fundamental wave included in the wave output from the wavelength conversion element 102. Alternatively, an optical fiber may be used that guides visible to near infrared band light. The optical fiber 103 is of a diameter for guiding the converted wave in single mode (SM), thereby preventing the fundamental wave from being coupled to the core mode of the optical fiber 103. Thus, the optical fiber 103 functions as a high-pass filter, and attenuates the component of the input fundamental wave. In other words, the optical fiber 103 has a function of wavelength selection for propagating only the converted wave.

A diffraction grating (a fiber Bragg grating (FBG)) 113 is formed near the edge portion of the optical fiber 103. The FBG 113 feeds back the fundamental wave output from the wavelength conversion element 102 to lock the wavelength or the frequency of the fundamental wave output from the LD 101. The reflectance of the FBG 113 with respect to the fundamental wave is preferably 50 to 100%.

In the example of FIG. 1, an end (the input end) of the FBG 113 is located at the edge portion of the optical fiber 103. The position of the FBG 113 on the input side is determined taking into account the amount by which the fundamental wave is attenuated in the waveguide, and the FBG 113 is formed to have a length that is within a given range (for example, within 10 cm).

For example, Nufern 460HP is used as the optical fiber 103. The optical fiber 103 may be configured by a polarization maintaining fiber.

A part of the fundamental wave from the LD 101 passes through the wavelength conversion element 102 as is, is coupled to the FBG 113 formed in the optical fiber 103 via the coupling member (GI lens) 104, and is partially reflected due to frequency (wavelength) selection. The frequency (wavelength) of the LD 101 is locked by this feedback. In this embodiment, the reflection band of the FBG 113 matches the wavelength of the converted wave output from the wavelength conversion element 102, thereby enabling a highly efficient wavelength conversion.

The GI lens 104 is provided as the coupling member on the input side of the optical fiber 103. The GI lens 104 is used for converting a small mode field diameter from the wavelength conversion element 102 to a mode field diameter that is larger than the wavelength conversion element 102. The GI lens 104 is configured by a GI lens formed by a graded-index or gradient-index (GI) optical fiber. A general-purpose lens, for example, "SiGRIN" produced by TOYO GLASS CO., LTD. can be used as the GI lens 104.

The GI lens 104 is designed so that the converted wave is coupled to the core of the optical fiber 103 highly efficiently. However, even in the near-infrared region of the fundamental wave, the GI lens 104 operates as a lens to the core of the optical fiber 103 in which the FBG 113 is formed, and achieves a relatively high coupling efficiency in the reflection band of the FBG 113.

Thus, by the GI lens 104 optimized for the converted wave, the mode field of the converted wave converted by and output from the wavelength conversion element 102 can be coupled with great efficiently to the aspect of the optical fiber 103 in which the FBG 113 is formed. The optical fiber 103 and the GI lens 104 are integrated by fusion splicing.

If the GI lens 104 described above is configured by a separate spatial optical system lenses, similar to the conventional technology, a large and complicated optical system is required to compensate large wavelength dispersion between the IR region of the fundamental wave and the visible light region of the converted wave. In contrast, a small and highly efficient SHG laser light source having a function of frequency (wavelength) locking can be easily implemented by using the GI lens 104 described in this embodiment.

Further, the optical path includes only two points where the light is coupled, i.e., between the LD 101 and the wavelength conversion element 102 and between the wavelength conversion element 102 and the waveguide (the optical fiber 103), thereby reducing optical loss and achieving high coupling efficiency.

The tip of the GI lens 104 is covered by an anti-reflection film (AR coat, etc.) for preventing reflection of the fundamental wave and the converted wave. Further, the tip (the input surface) of the GI lens 104 may be formed so as to be skewed with respect to the optical axis, or to have a spherical shape, thereby reducing the surface reflection at the input surface, and suppressing unnecessary light other than a given wavelength reflected by the FBG 113 from being reflected to the LD 101. In the above configuration, the wavelength of the fundamental wave is 1064 nm, while the wavelength after the wavelength conversion by the wavelength conversion element 102 is 532 nm. However, the present invention can be applied to a configuration in which wavelength conversion is performed using other wavelengths.

First Embodiment

First Example of Module Configuration of Laser Light Source

FIG. 2 is a perspective view of an example of module configuration of a laser light source according to a first embodiment. In a laser light source module 200 in this configuration, the LD 101 described above, the PPLN as the wavelength conversion element 102, and an optical-fiber fixing unit 202 that fixes and holds the edge portion of the optical fiber 103 are provided on a rectangular (planer) semiconductor substrate (Si substrate) 201 by face-down bonding.

FIG. 3A is a partial cross-sectional view of the laser light source module 200 depicted in FIG. 2; FIG. 3B is a cross-sectional view along A-A line in FIG. 3A. The optical-fiber fixing unit 202 is formed by a Si substrate and formed as a block. A housing groove 202a corresponding to the diameter of a covered portion 103A of the optical fiber 103 and a housing groove 202b corresponding to the diameter of an uncovered portion 103B of the optical fiber 103 are formed on the bottom surface 202B (a surface facing the Si substrate 201) of the optical-fiber fixing unit 202.

The edge portion of the optical fiber 103 is bonded and fixed by resin adhesive, etc., with the covered portion 103A thereof being housed in the housing groove 202a. The uncovered portion 103B having a given length from the covered portion 103A is exposed at the edge portion of the optical fiber 103. The uncovered portion 103B is housed in the housing groove 202b, and bonded and fixed by resin adhesive etc. Thus, the edge portion of the optical fiber 103 is fixed in the optical-fiber fixing unit 202. Here, the optical axis (the center position) of the edge portion of the optical fiber 103 coincides with the position of the bottom surface 202B of the optical-fiber fixing unit 202 as depicted in FIG. 3B.

The optical-fiber fixing unit 202 is bonded and fixed to the edge portion of the Si substrate 201. An adjustment groove 201a that houses the optical fiber 103 without being in contact with the optical fiber 103 is formed on the upper surface 201A (a surface facing the optical-fiber fixing unit 202) of the Si substrate 201. The adjustment groove 201a is formed so as to have a diameter larger than the diameter of the covered portion 103A of the optical fiber 103 so that the optical-fiber fixing unit 202 can be moved vertically and horizontally (along X, Y, and Z axis of FIG. 2) above the Si substrate 201 for optical axis adjustment.

With respect to the component of the fundamental wave, the electric field is widely distributed in the cladding of the optical fiber 103. Thus, the optical fiber 103 is likely to disperse light if the fiber is subjected to bending stress, and becomes unable to stably guide the wavelength-converted light (the visible light) over a long distance.

The bending stress due to an external force can be suppressed by providing the FBG 113 at the edge portion of the optical fiber 103 as described above. The bending stress due to an external force can be further suppressed by using the optical-fiber fixing unit 202 to fix the edge portion of the optical fiber 103 including the position where the FBG 113 is provided, thereby enabling the wavelength-converted light (the visible light) to be stably guided over a long distance.

The optical fiber 103 can be made less susceptible to external forces by providing a ferrule on the optical fiber 103 at the position where the optical fiber 103 is fixed by the optical-fiber fixing unit 202, and fixing the optical-fiber fixing unit 202 via the ferrule.

Assembly of the laser light source module 200 having the above configuration is described. The LD 101 is placed on and fixed to the Si substrate 201. The wavelength conversion element 102 is placed while adjusting the optical axis by monitoring the fundamental wave output from the LD 101 and the converted light by a CMOS camera, an optical detector, etc. The optical-fiber fixing unit 202 is placed, while monitoring the fundamental wave and the converted light, on the Si substrate 201 at the position to where the wavelength conversion element 102 outputs the light.

In this state, the entire bottom surface 202B or several points of the bottom surface 202B of the optical-fiber fixing unit 202 contact(s) the upper surface 201A of the Si substrate 201 depicted in FIG. 3B so that the optical-fiber fixing unit 202 can slide on the Si substrate 201. In this state, the covered portion 103A and the uncovered portion 103B of the optical fiber 103 are fixed in the housing grooves 202a and 202b of the optical-fiber fixing unit 202, respectively, and the height of the tip of the optical fiber 103 coincides with the height of the output light from the wavelength conversion element 102 (state depicted in FIG. 3A).

Thus, the optical axis of the output light from the wavelength conversion element 102 and the optical axis of the optical fiber 103 can be adjusted by moving the optical-fiber fixing unit 202 along the X axis and/or the Y axis of FIG. 2. The assembly of the module is completed by bonding and fixing the optical-fiber fixing unit 202 to the Si substrate 201 by resin, solder, etc.

Bonding members such as Au are provided on surfaces (the surfaces bonded to the Si substrate 201) of the LD 101 and the wavelength conversion element 102, and micro bumps are formed on the bonding members. A bonding member such as Au is also provided on the Si substrate 201. Thus, the LD 101 and the wavelength conversion element 102 can be bonded with precision to the Si substrate 201 by room-temperature bonding at the room temperature without pressure. The bonding members formed with an electrical conductor such as Au can be also used as power supply terminals and/or control terminals of the LD 101 and the wavelength conversion element 102.

According to the first embodiment described above, light from which the component of the fundamental wave included in the output wave from the wavelength conversion element is removed can be guided by using a waveguide that attenuates the component of the fundamental wave and by providing an FBG near the input end of the waveguide. The FBG also has a function of wavelength locking for the LD, thereby stabilizing the output of the LD. Further, a small laser light source with a lower optical loss can be obtained without a special configuration.

Second Embodiment

Second Example of Module Configuration of Laser Light Source

FIG. 4 is a side view of an example of module configuration of the laser light source according to a second embodiment, and FIG. 5 is a perspective view thereof. In contrast to the first embodiment in which the optical fiber 103 is used as the waveguide, the waveguide of a laser light source module 400 according to the second example is configured by a substrate and is bonded to the Si substrate 201. The waveguide can be configured by a waveguide 401 formed as a substrate of such as Si (hereinafter, "waveguide substrate 401"), and an optical waveguide 410 is formed on the bottom surface of the waveguide substrate 401.

Diffraction gratings 411 are formed on the waveguide 410 at a given interval over a given distance along the optical axis.

FIG. 6 is a cross-sectional view along A-A' line in FIGS. 4 and 5. As depicted, the waveguide 410 is formed as a convex ridge at the center portion of the waveguide substrate 401 along the optical axis. Diffraction gratings 411 are formed on the waveguide 410. The diffraction gratings 411 can be easily formed by photolithography, for example.

A bonding member 601 such as Au is formed on the bottom surface of the waveguide substrate 401. Similarly, a bonding member such as Au is formed on the Si substrate 201 at the position where the waveguide substrate 401 is bonded. Thus, the waveguide substrate 401 can be easily bonded to the Si substrate 201 via the bonding members 601 of Au.

The waveguide substrate 401 can be bonded to the Si substrate 201 by room-temperature bonding without pressure, by forming micro bumps on the bonding member 601 of either the waveguide substrate 401 or the Si substrate 201.

According to the second embodiment, the LD 101, the wavelength conversion element 102, and the waveguide substrate 401 as a waveguide that are provided on the Si substrate 201 can each be mounted with precision on the Si substrate 201 by room-temperature bonding.

FIGS. 7A and 7B are enlarged partial perspective views of the diffraction gratings. FIG. 7A depicts an example in which the diffraction gratings 411 are formed on the convex waveguide 410 forming the ridge depicted in FIG. 6. FIG. 7B depicts an example in which the diffraction gratings 411 are provided on the waveguide 410 formed by proton exchange. In this case, the waveguide 410 is not convex and formed inside the waveguide substrate 401, and the diffraction gratings 411 are provided on the surface of the waveguide substrate 401.

According to the configuration described above, optical elements can be mounted with precision on a planar Si substrate, and a small and inexpensive laser light source can be obtained with a minimum number of elements. Further, optical axis adjustment of optical elements during assembly can be easily performed.

According to the second embodiment, similar to the first embodiment, light from which the component of the fundamental wave included in the output wave from the wavelength conversion element has been removed can be guided by using a waveguide that attenuates the component of the fundamental wave and by providing diffraction gratings near the input end of the waveguide. The diffraction gratings also have a function of wavelength locking for the LD, thereby stabilizing the output of the LD. Further, a small laser light source with a lower optical loss can be obtained without a special configuration.

Further, all of the optical elements on the Si substrate can be easily mounted by surface bonding, etc., since the waveguide is formed as a substrate and bonded to the Si substrate. Furthermore, the waveguide is not likely to be affected by external forces since the waveguide itself is formed as a substrate, thereby maintaining the given characteristics of the waveguide and outputting only the converted wavelength to the outside.

The present invention can be applied to not only a configuration in which the wavelength is locked by an external oscillator, but also a configuration in which the frequency is locked by feeding back a part of the fundamental wave using pulse laser.

As described, the laser light source according to the present invention is useful for a laser light source with a wavelength conversion element that converts the fundamental wave and outputs the converted wave, and in particular, for a small and highly efficient laser light source and for a light source of an optical communication system and/or a display system (a laser projector, etc.) that include the laser light source.

According to the configuration described, the fundamental wave output from the wavelength conversion element is fed back by the diffraction grating formed in the waveguide, and the wavelength or the frequency of the fundamental wave is locked. The converted wave can be efficiently output with minimal loss by merely providing the waveguide in which the FBG is provided, since the waveguide attenuates the component of the fundamental wave.

Further, the waveguide is an optical fiber.

Accordingly, the converted wave can be efficiently output with minimal loss with a simple configuration including a general-purpose optical fiber.

Further, a portion of the optical fiber where the diffraction grating is formed is fixed so as to not move.

Accordingly, the effects of external forces on the optical fiber can be reduced, and the converted wave can be efficiently guided and output.

Further, the waveguide is a waveguide substrate that is a given substrate on which a waveguide is formed.

Accordingly, the effects of external forces can be reduced, and the converted wave can be efficiently guided and output. Further, the substrate of the waveguide can be easily mounted on the substrate by surface bonding, etc.

The waveguide guides the converted wave in single mode.

Accordingly, the converted wave can be efficiently guided and output.

Further, the laser light source includes a graded-index optical fiber as a coupling member that optically couples the wavelength conversion element and the waveguide. Although "graded-index" can be also called "gradient-index", "graded-index" is used herein.

According to the configurations described above, the number of elements can be reduced and the size of the device can be reduced, the laser element and the wavelength conversion element can be mounted with precision on the semiconductor substrate, and the assembly can be made easier.

According to the present invention, a fundamental wave that has not been converted by the wavelength conversion element can be suppressed from being output, efficient wavelength conversion with minimal loss and size reductions can be achieved.

What is claimed is:

1. A laser light source comprising:
   a laser element that outputs a fundamental wave;
   a wavelength conversion element into which the fundamental wave is input and that converts at least a part of the fundamental wave input therein to a converted wave having a wavelength shorter than the wavelength of the fundamental wave;
   a waveguide, consisting of a single optical fiber, that attenuates a component of the fundamental wave included in an output wave from the wavelength conversion element; and
   a diffraction grating that is formed on a portion of the optical fiber and feeds back the fundamental wave output from the wavelength conversion element to lock the wavelength or the frequency of the fundamental wave output from the laser element,
   wherein the diffraction grating is formed at a position determined taking into account an amount by which the fundamental wave is attenuated in the waveguide, and
   wherein the waveguide has a constant diameter.

2. The laser light source according to claim 1, wherein a portion of the optical fiber where the diffraction grating is formed is fixed so as to not move.

3. The laser light source according to claim 1, wherein the waveguide is a waveguide substrate that is a given substrate on which a waveguide is formed.

4. The laser light source according to claim 1, wherein the waveguide guides the converted wave in single mode.

5. The laser light source according to claim 1, further comprising a graded-index optical fiber as a coupling member that optically couples the wavelength conversion element and the waveguide.

6. The laser light source according to claim 4, wherein an optical path between the laser element and the waveguide includes only two points where light is coupled.

* * * * *